(12) United States Patent
Imamura et al.

(10) Patent No.: US 6,510,041 B1
(45) Date of Patent: Jan. 21, 2003

(54) ELECTROLYTIC CAPACITOR UNIT FOR AUDIO APPARATUS

(75) Inventors: Masaaki Imamura, Fujisawa (JP); Yasuhiko Soga, Fujisawa (JP); Mitsuru Yoneda, Fujisawa (JP)

(73) Assignee: Elna Kabushiki Kaisha, Fujisawa (JP)

( * ) Notice: Subject to any disclaimer, the term of this patent is extended or adjusted under 35 U.S.C. 154(b) by 0 days.

(21) Appl. No.: 09/031,824

(22) Filed: Feb. 27, 1998

(30) Foreign Application Priority Data

Sep. 30, 1997 (JP) .............................................. 9-282546

(51) Int. Cl.[7] .................................................. H01G 9/00
(52) U.S. Cl. ........................................ 361/500; 361/522
(58) Field of Search ................................ 361/500, 541, 361/522, 328, 329; 381/120

(56) References Cited

U.S. PATENT DOCUMENTS 4,110,559 A * 8/1978 Hjelm et al. ................. 330/202
5,036,292 A * 7/1991 Hjelm et al. ................. 330/202

FOREIGN PATENT DOCUMENTS

DE          42 39 500      * 5/1994         ........... B60R/16/04

* cited by examiner

*Primary Examiner*—Kristine Kincaid
*Assistant Examiner*—Eric W. Thomas
(74) *Attorney, Agent, or Firm*—Kanesaka & Takeuchi

(57) ABSTRACT

A power source of an audio apparatus loaded on a car is a battery with a rated voltage of 12V or more. An electrolytic capacitor unit is utilized as a power source filter in the audio apparatus. As the electrolytic capacitor unit, a given number of aluminum electrolytic capacitors with the same rating is connected in parallel to gain a capacitance of 1 F (farad) or more and an internal resistance of less than 1.0 mΩ as a whole. Thus, the electrolytic capacitor unit can provide, in addition to a large capacitance necessary for a power source filter for an audio apparatus, sufficiently low internal resistance and stable output voltage.

5 Claims, 2 Drawing Sheets

ELECTROLYTIC CAPACITOR UNIT FOR AUDIO APPARATUS

BACKGROUND OF THE INVENTION

This invention relates to an electrolytic capacitor unit for an audio apparatus, and more particularly to an electrolytic capacitor unit for an audio apparatus with a low internal resistance especially suitable for a power source filter in an audio apparatus loaded in a car (car audio apparatus).

Most of car audio apparatus are powered by car batteries (12V power source in Japan, for example). In order to improve sound quality, a capacitor is connected as a filter for a smoothing power source between a battery and a power amplification.

When a battery loaded on a car is 12V, an electrolytic capacitor with a rating of 16V or more and about 1 F is utilized as a power source filter. Conventionally one large-sized electrolytic capacitor with a shaft length of 120 mm and a diameter of 76 mm approximately, for example, is utilized for a high-volume capacitor.

The large-sized electrolytic capacitor, however, has an internal resistance as high as 1.8 mΩ, thus causing a change in an output voltage and making reproduction of high-quality sound difficult.

SUMMARY OF THE INVENTION

The present invention has been made to solve the above-described disadvantage. An object of the present invention is to provide an electrolytic capacitor unit for an audio apparatus, in which in addition to a large capacitance necessary for a power source filter for an audio apparatus loaded in a car, a sufficiently low internal resistance and stable output voltage can be obtained.

According to the present invention, in an electrolytic capacitor unit for an audio apparatus utilized as a power source filter in an audio apparatus loaded in a car, a power source of which is supplied from a battery with a rated voltage of 12V or more, a given number of aluminum electrolytic capacitors with the same rating is connected in parallel to gain a capacitance of 1 F (farad) or more and an internal resistance of less than 1.0 mΩ as a whole, so that the object can be achieved.

In the case above, the whole given number of the aluminum electrolytic capacitors can be mounted on one circuit substrate. But to keep them in a smaller place, the aluminum electrolytic capacitors are preferably divided into more than one group and each group is mounted on an individual circuit substrate.

The aluminum electrolytic capacitors, for example, are divided into four groups. Each group with a capacitance of about 0.25 F and an internal resistance of less than 4.0 mΩ is mounted on an individual circuit substrate. The four groups, that is, four circuit substrates can be connected in parallel.

Similarly, the aluminum electrolytic capacitors are divided into two groups. Each group with a capacitance of about 0.5 F and an internal resistance of less than 2.0 mΩ is mounted on an individual circuit substrate. The two groups, that is, two circuit substrates can be connected in parallel.

In addition, the aluminum electrolytic capacitors are divided into a first group and a second group. The first group has a capacitance of about 0.75 F and an internal resistance of less than 1.5 mΩ and the second group has a capacitance of about 0.25 F and an internal resistance of less than 4.0 mΩ. Each group is mounted on an individual circuit substrate. The circuit substrates of the first and the second groups can be connected in parallel.

As described above, according to the present invention, an electrolytic capacitor unit for an audio apparatus with a capacitance of 1 F and an internal resistance of less than 1.0 mΩ is obtained, thus improving voice band, sound sensation, sound resolution, sound image, and sound field, whereby high-grade reproduced sound can be obtained.

DETAILED DESCRIPTION OF PREFERRED EMBODIMENTS

Next, preferred embodiments of the present invention will be described with reference to FIGS. 1–2(c) to understand better the technical idea of the present invention.

Figure 1:
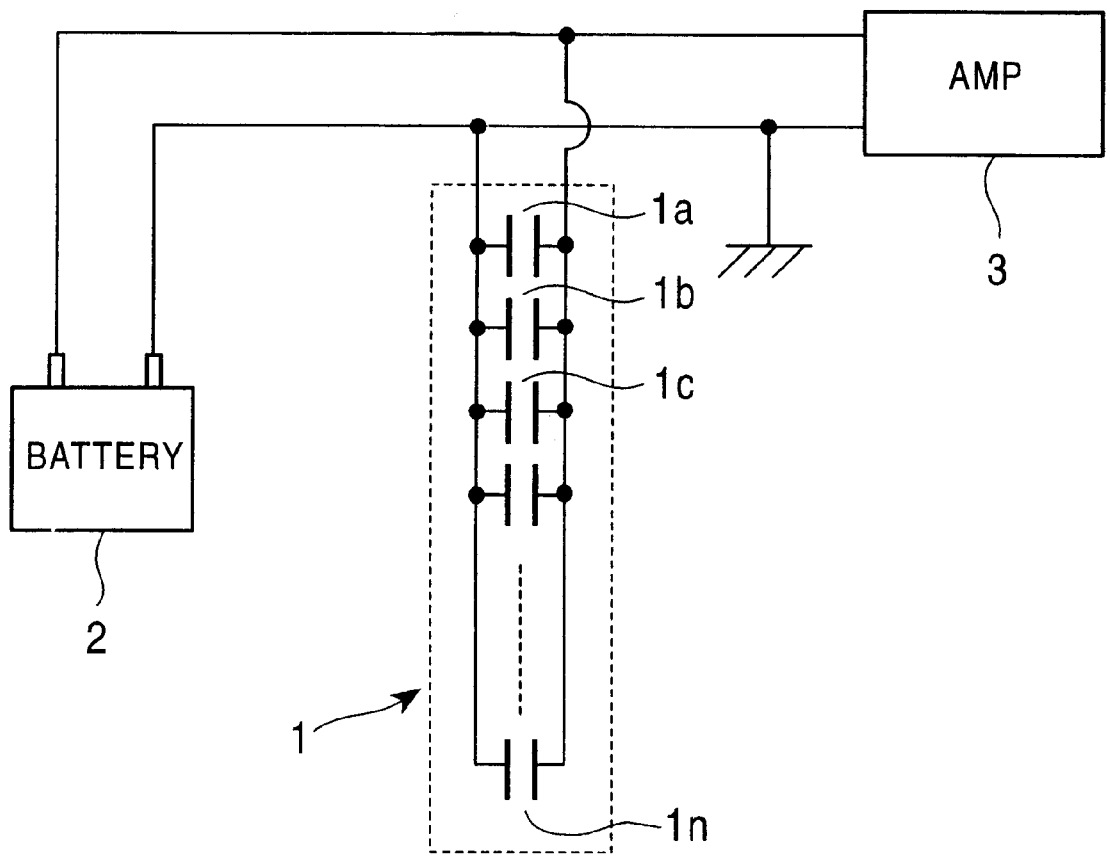
FIG. 1 is a schematic circuit diagram showing an example in which an electrolytic capacitor unit for an audio apparatus according to the present invention is utilized as a power source filter in an audio apparatus loaded in a car.

As shown in FIG. 1, an electrolytic capacitor unit for an audio apparatus 1 is connected as a power source filter between a battery 2 as a power source loaded in a car and a power amplification 3 in a car audio apparatus.

In the present invention, the electrolytic capacitor unit for the audio apparatus 1 is composed of n number of aluminum electrolytic capacitors 1a–1n with the same rating which are connected in parallel. When a capacitance and an internal resistance of each aluminum electrolytic capacitor are represented by C and R, respectively, a capacitance of the whole electrolytic capacitor unit for the audio apparatus 1 is C×n(F) and the internal resistance thereof is R/n(Ω).

The present invention is further described with the following examples. However, it should be noted that the present invention is not limited to the examples.

EXAMPLE 1

In example 1, to obtain a capacitance of 1 F or more necessary for a power source filter in an audio apparatus loaded in a car, 122 aluminum electrolytic capacitors (40 mm in shaft length, 18 mm in diameter) with a rating of 16V·8200 $\mu$F and an internal resistance of 25 mΩ are connected in parallel on one circuit substrate to make a capacitor unit.

An internal resistance of the capacitor unit has a theoretical value of 25 mΩ/122 and an approximate value of 0.2 mΩ, but 0.75 mΩ in an actual measurement. It is inferred that this is caused by a wiring resistance, connecting resistance in a soldered portion of a lead terminal and the like.

As described above, even when a little larger wiring resistance and connecting resistance are estimated, a capacitor unit as a whole with a capacitance of about 1 F and an internal resistance of less than 1.0 mΩ can be obtained.

By the way, a rather large circuit substrate is required to mount 122 aluminum electrolytic capacitors, each of which has a shaft length of 40 mm and a diameter of 18 mm on one circuit substrate. When there is an enough room for the circuit substrate, that matter may be left out of consideration. But, the aluminum electrolytic capacitors can be divided into groups as described hereinafter and each group can be mounted on each of several circuit substrates.

EXAMPLE 2

Figure 2C:
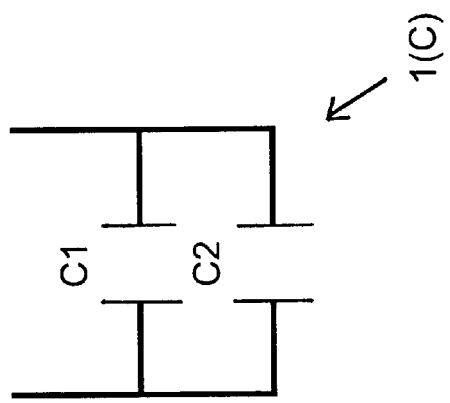
FIGS. 2(a)–2(c) are schematic circuit diagrams for showing other examples of the invention.
Figure 2B:
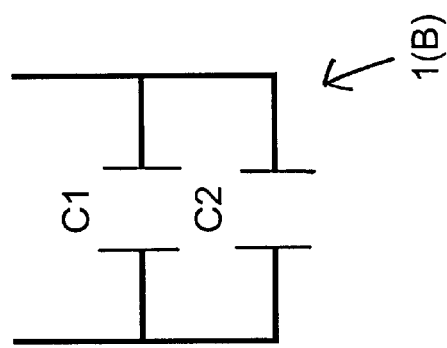
Figure 2A:
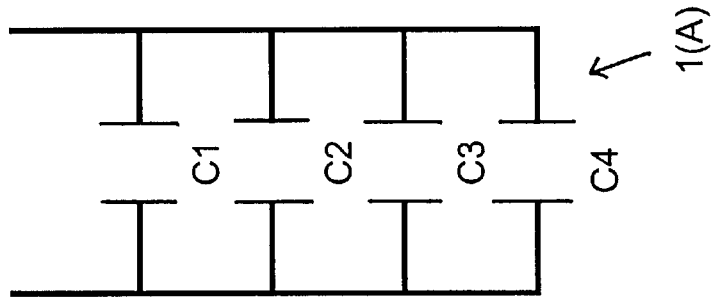

In example 2, as shown in FIG. 2(a), 31 aluminum electrolytic capacitors 1(A) with the above rating (16V·8200 µF, 25 mΩ as an internal resistance) are connected in parallel on one circuit substrate to form a group. Four groups, that is, four circuit substrates C1–C4 are connected in parallel to make a capacitor unit.

In this case, a capacitance per group is about 0.25 F and an internal resistance per group is 25 mΩ/31 and 0.8 mΩ as an approximate value, but 3.0 mΩ in actual measurement since a wiring resistance, connecting resistance and the like are included. Thus, a capacitor unit as a whole has a capacitance of about 1 F and an internal resistance of 0.75 mΩ.

In grouping example 2, 124 aluminum electrolytic capacitors (31×4=124) are used, but increase or decrease of two or so is not important. In brief, when the aluminum electrolytic capacitors are equally divided into four groups as shown in this example, an internal resistance per group may be less than 4.0 mΩ.

EXAMPLE 3

In example 3 as shown in FIG. 2(b), 61 aluminum electrolytic capacitors with the above rating (16V·8200 µF, 25 mΩ as an internal resistance) are connected in parallel on one circuit substrate to form a group. Two groups, that is, two circuit substrates C1, C2 are connected in parallel to make a capacitor unit.

In this case, a capacitance per group is about 0.5 F and an internal resistance per group is 25 mΩ/61 and 0.4 mΩ as an approximate value, but 1.5 mΩ in an actual measurement since a wiring resistance, connecting resistance and the like are included. Thus, a capacitor unit as a whole has a capacitance of about 1 F and an internal resistance of 0.75 mΩ.

EXAMPLE 4

In example 4 as shown in FIG. 2(c), 122 aluminum electrolytic capacitors 1(C) with the above rating (16V·8200 µF, 25 mΩ as an internal resistance) are divided into a first group C1 and a second group C2. In the first group, 91 aluminum electrolytic capacitors are mounted in parallel on a first circuit substrate, and in the second group, 31 aluminum electrolytic capacitors are mounted in parallel on a second circuit substrate. The first and the second groups are connected in parallel to make a capacitor unit.

In this case, in the first group, a capacitance is about 0.75 F and an internal resistance is 25 mΩ/91 and 0.27 mΩ as an approximate value, but 0.75 mΩ in an actual measurement since a wiring resistance, connecting resistance and the like are included.

In the second group, like a group of example 2, a capacitance is about 0.25 F and an internal resistance is 25 mΩ/31 and 0.8mΩ as an approximate value, but 3.0 mΩ in an actual measurement since a wiring resistance, connecting resistance and the like are included. Thus, a capacitor unit as a whole which is made by connecting the first and the second groups in parallel has a capacitance of about 1 F and an internal resistance of 0.6 mΩ.

As shown in examples 2 to 4, 122 aluminum electrolytic capacitors are divided into groups, thereby saving a space. In other words, as compared with the case that 122 aluminum electrolytic capacitors are mounted on one circuit substrate, in example 2, for instance, 31 aluminum electrolytic capacitors are mounted respectively on each of four circuit substrates which are laminated, whereby the necessary space decreases to one third, a half in example 3 and two thirds in example 4 although they are bulky.

Comparison 1

In order to obtain a capacitor unit with a capacitance of 1 F or more, 18 aluminum electrolytic capacitors (45 mm in shaft length, 35 mm in diameter) with a rating of 16V·56000 µF, for example, are connected in parallel.

In addition, the internal resistance of the aluminum electrolytic capacitor with a rating of 16V·56000 µF is 9.4 mΩ and therefore the internal resistance of the whole capacitor unit made by connecting 18 aluminum electrolytic capacitors in parallel is 9.4 mΩ/18 and 0.52 mΩ as an approximate value, which satisfies the condition of the present invention that the internal resistance is less than 1.0 mΩ.

However, when 18 aluminum electrolytic capacitors with a rating of 16V·56000 µF are actually connected in parallel and the whole internal resistance is measured, the whole internal resistance is 1.15 mΩ in the actual measurement since a wiring resistance and connecting resistance in a soldered portion are included.

Next, the capacitor units according to the above-described examples 1 to 4 and a capacitor unit according to comparison 1 are actually used as a capacitor for a smoothing power source for a car audio apparatus with a power source of 12V. Six persons listen to the reproduced sound by the above audio apparatus and assess the voice band, sound sensation, sound resolution, sound image and sound field on a maximum scale of 10 points. The results are shown in the following table.

|  | voice band | sound sensation | sound resolution | sound image | sound field |
| --- | --- | --- | --- | --- | --- |
| EXAMPLE 1 to 4 | 8 | 8 | 9 | 8 | 9 |
| COMPARISON 1 | 5 | 5 | 5 | 5 | 5 |

In this table, (1) voice band is a frequency characteristic in which a high score means the frequency band of reproduced sound is broad. (2) Sound sensation is an S-N ratio of sound which means the reproducibility of sound spread. (3) Sound resolution is a resolution of sound which means the degree of catching of overlapping melodies, for instance. (4) Sound image is beauty of sound which means transparency and outline of sound. (5) Sound field is a profundity of sound which means coherence of sound.

As a result, the capacitor unit according to comparison 1 gains 5 points respectively in the voice band, sound sensation, sound resolution sound image and sound field, while the capacitor units according to examples 1 to 4 gain a high score of 8 points in the voice band, 8 points in the sound sensation, 9 points in the sound resolution, 8 points in the sound image, and 9 points in the sound field so that the middle register becomes clear and a vocal becomes more natural in comparison with comparison 1.

The above is a detailed description of the present invention according to concrete examples. Those skilled in the art who understand the above-described contents can easily think of variations, modifications, and equivalents of the apparatus. Therefore, it should be noted that the scope of the present invention is limited by the appended claims and a range of equivalency of the claims.

What is claimed is:

1. An electrolytic capacitor unit for an audio apparatus utilized as a power source filter in the audio apparatus, said audio apparatus being loaded in a car having a battery with a rated voltage of 12V or more and having a power source from the battery, said electrolytic capacitor unit comprising:

a predetermined number of capacitor groups connected parallel to each other, each capacitor group including aluminum electrolytic capacitors having a same rating and connected parallel to each others said capacitor groups providing a capacitance of 1 F or more and an internal resistance of less than 1.0 mΩ as a whole.

2. The electrolytic capacitor unit for the audio apparatus according to claim 1, wherein said predetermined number of capacitor groups is four connected in parallel, each of the four capacitor groups having a capacitance of about 0.25 F and an internal resistance of less than 4.0 mΩ.

3. The electrolytic capacitor unit for the audio apparatus according to claim 1, wherein said predetermined number of capacitor groups is two connected in parallel, each of the two capacitor groups having a capacitance of about 0.5 F and an internal resistance of less than 2.0 mΩ.

4. The electrolytic capacitor unit for the audio apparatus according to claim 1, wherein said predetermined number of capacitor groups is two formed of a first group and a second group connected in parallel, the first group having a capacitance of about 0.75 F and an internal resistance of less than 1.5 mΩ and the second group having a capacitance of about 0.25 F and an internal resistance of less than 4.0 mΩ.

5. An electrolytic capacitor unit for an audio apparatus utilized as a power source filter in the audio apparatus, said audio apparatus being loaded in a car having a battery with a rated voltage of 12V or more and having a power source from the battery, said electrolytic capacitor unit comprising:

a predetermined number of aluminum electrolytic capacitors with a same rating, said aluminum electrolytic capacitors being connected in parallel and forming four groups, each of said four groups having a capacitance of about 0.25 F and an internal resistance of less than 4.0 mΩ, said four groups being connected in parallel and providing a capacitance of 1 F or more and an internal resistance of less than 1.0 mΩ as a whole.

* * * * *